United States Patent [19]

Ohta

[11] Patent Number: 4,527,187
[45] Date of Patent: Jul. 2, 1985

[54] HIGH SENSITIVITY FM SIGNAL DEMODULATION SYSTEM

[75] Inventor: Tomozo Ohta, Tokyo, Japan

[73] Assignee: Oki Electric Industry Co., Ltd., Japan

[21] Appl. No.: 413,386

[22] PCT Filed: Aug. 31, 1981

[86] PCT No.: PCT/JP81/00207
§ 371 Date: Aug. 23, 1982
§ 102(e) Date: Aug. 23, 1982

[87] PCT Pub. No.: WO83/00974
PCT Pub. Date: Mar. 17, 1983

[51] Int. Cl.³ .............................................. H04N 9/50
[52] U.S. Cl. .................................................. 358/23
[58] Field of Search ................... 358/23, 21 R, 36, 37, 358/40

[56] References Cited

FOREIGN PATENT DOCUMENTS 56-84005  7/1981  Japan .

Primary Examiner—Richard Murray
Attorney, Agent, or Firm—Martin Novack

[57] ABSTRACT

The present invention relates to the improved demodulation system which improves the noise characteristics for the demodulation of a wideband television FM signal. An adapter for improving the ratio C/N is provided at the output of a bandpass filter (7), and the output of said adapter is applied to a discriminator (14) which demodulates the FM signal, through a limiter (13). The adapter has a variable bandpass filter (8), the center frequency and the bandwidth of which are controllable, and said variable bandpass filter (8) is inserted in an FM signal path. The bandwidth of the variable bandpass filter (8) is controlled so that said bandwidth is wide when the input carrier level is high, and said bandwidth is narrow when the input carrier level is low. The center frequency of the variable bandwidth filter (8) is controlled so that said center frequency follows to the instantaneous frequency of the color sub-carrier component (3.58 MHz). A phase detector (10) is coupled with the input and the output of said variable bandpass filter (8) in order to derive the color sub-carrier component, and the output of said phase detector controls said variable bandpass filter through a narrow-band bandpass filter.

12 Claims, 13 Drawing Figures

HIGH SENSITIVITY FM SIGNAL DEMODULATION SYSTEM

This application claims priority from International Application No. PCT/JP81/00207 filed Aug. 31, 1981.

FIELD OF THE INVENTION

The present invention relates to a high sensitivity demodulation system which improves the noise characteristics of a wideband television (picture) signal—an FM modulation signal, with low input level, by using a simple structure.

BACKGROUND OF THE INVENTION

A prior simple demodulation system for a frequency demodulation signal is a discriminator system using an LC circuit, or a delay line. In this case, the signal-to-noise ratio S/N of the demodulated signal for the C/N of the FM modulated input signal (C/N is the ratio of the carrier signal power to the noise power) is expressed:

$$S/N = C/NFI$$

where FI is a constant. Thus, the value S/N of the demodulated signal is proportional to the C/N of the input signal.

On the other hand, the value C/N depends upon the bandwidth of a bandpass filter, which is provided at the input side of a demodulator for restricting the bandwidth of both the noise power and the signal power. Generally, that equation is satisfied when the value C/N is higher than 10 dB, and when the value C/N is less than that value, the value S/N is rapidly deteriorated. That value of C/N (=10 dB) is called a threshold level.

An FM modulation system is utilized for transmitting a television (picture) signal, for instance through a satellite relay system. In this case, the receive level at a receive side is near the threshold level because of the restriction of the transmission power of a satellite, the stability of the transmission path, and/or the cost of the reception equipment at an earth station. Accordingly, an input signal level is decreased by the change of the condition of the transmission path, and that level becomes lower than the threshold level. Then, the demodulated picture signal on a television screen is deteriorated considerably by impulse noise generated in the transmission path. Sometimes no demodulated picture signal is obtained.

Accordingly, it is important to improve the characteristics in the presence of impulse noise for improving a television picture and/or the cost of reception equipment. In particular, it is very important to improve the noise characteristics when a direct broadcasting satellite communication system is utilized.

Figure 1:
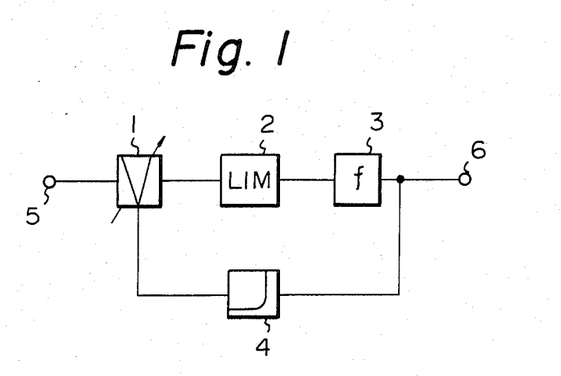
FIG. 1 is a block diagram of a prior demodulation system.

Many systems have been proposed for improving the threshold level. One of them is a dynamic tracking system (see PROC IEE vol 115, No.11, November 1968 pages 1597–1606) as shown in FIG. 1. The reference numeral 1 is a narrow band variable bandpass filter the center frequency of which is controllable, 2 is a level limiter, 3 is a frequency discriminator, 4 is a lowpass filter, 5 is a signal input terminal, 6 is an output terminal of the demodulated signal. The FM signal at the input terminal 5 passes the variable bandpass filter 1, the limiter 2, and is demodulated by the discriminator 3. The demodulated signal controls the center frequency of the variable bandpass filter 1 through the lowpass filter 4 which removes the high frequency component noise. The center frequency of the variable bandpass filter 1 follows to the instantaneous frequency change of the input signal at the input terminal 5. That is to say, the amplitude component and the phase component of the output of the discriminator is fedback to control the center frequency of the variable bandpass filter.

Next, the demodulation of an FM signal of a color television signal is described. A color picture signal has an intensity signal and a color sub-carrier signal, and the total bandwidth of the color picture signal is 4.2 MHz. Further, the frequency spectrum of a color picture signal depends considerably upon the picture, content in particular, the amplitude of the color subcarrier component depends upon the saturation factor of a color of a picture.

Due to the nature of a color picture signal, a conventional FM signal demodulation system of FIG. 1 has some disadvantages. First, it is almost impossible to feedback the amplitude and the phase of the output of the discriminator through the feedback circuit having an amplifier and a lowpass filter to the variable bandpass filter, with stability and following completely to the instantaneous change of the input signal, since a television signal has very wideband.

If the feedback signal is not complete, the deviation of an FM signal can not pass the variable bandpass filter, and, the demodulated waveform will be deformed. When the value C/N and/or S/N is low, that waveform deformation is not critical. The higher the value C/N is, the more critical the waveform deformation is. Therefore, when the value C/N is high, a simple discriminator having a fixed bandwidth provides better picture quality than the circuit of FIG. 1 does.

Further, when the frequency deviation is large, and the high modulation frequency component is not completely fedback, that component having the large FM deviation power is removed by the variable bandpass filter, thus, the value C/N is deteriorated, and the value C/N becomes less than the threshold level. Thus, the presence of a variable bandpass filter can provide an undesirable effect.

Even when the feedback circuit functions correctly, the noise component accompanying the picture signal also controls the variable bandpass filter, and the noise component also passes that variable bandpass filter. Therefore, when there is some noise power, the demodulated picture signal is deteriorated, and in particular, when the signal level is rather low, the demodulated picture signal is much affected by the noise power. For instance, when the saturation level of the modulated picture signal is low, and the amplitude of the color sub-carrier component is low, the wideband noise power is demodulated, and that demodulated noise power deteriorates the picture on the screen by generating visible color noise.

SUMMARY OF THE INVENTION

The object of the present invention is to overcome the disadvantages of prior systems, and to improve the noise characteristics of an FM signal modulated with a picture signal in particular when the value C/N is low, by utilizing the particular nature of a color picture signal.

According to the present invention, a variable bandpass filter in which the center frequency and the bandwidth are controllable, and a fixed bandpass filter are inserted in series in a signal circuit. The input signal and the output signal of the variable bandpass filter are phase-detected, and then, a color sub-carrier component is derived from the phase-detected signal, then, the center frequency of the variable bandpass filter is controlled according to the frequency change of the input signal, by using that color sub-carrier component. Preferably, said color sub-carrier component is applied to the variable bandpass filter through a non-linear circuit which has amplitude non-linearity characteristics. Preferably, when the value C/N is lower than the predetermined value, the bandwidth of the variable bandpass filter is adjusted to be narrower so that the C/N is improved. Accordingly, the demodulated signal of the output of the discriminator has an improved value of S/N, and thus, the picture quality on a screen becomes better with the improvement of the noise characteristics.

PREFERRED EMBODIMENTS OF THE INVENTION

Figure 2:
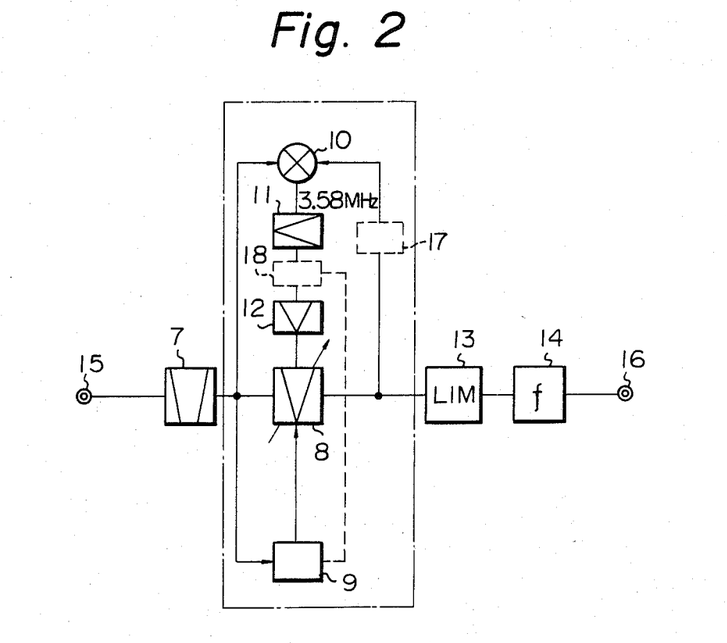
FIG. 2 is a block diagram of the demodulation system according to the present invention.

FIG. 2 shows the block diagram of an embodiment of the present invention, and the circuits enclosed by the dotten line compose an adapter, which can be coupled with a prior demodulation system. In the figure, the reference numeral 7 is a reference bandpass filter having a fixed bandwidth, 8 is a variable bandpass filter in which both the center frequency and the bandwidth are separately controllable by respective external signals, 9 is a level detector for detecting an input signal level (or the ratio C/N of the carrier level to the noise level), 10 is a phase-detector, 11 is a color sub-carrier bandpass filter having a narrow bandwidth for deriving the color sub-carrier component, 12 is a color sub-carrier adjuster for adjusting the amplitude and the phase of the color sub-carrier signal component, 13 is a limiter circuit, 14 is a frequency discriminator, 15 is an FM signal input terminal for receiving an FM signal modulated by carrier frequency, 16 is an output terminal of the demodulated signal, 17 and 18 are a phase shifter and a switching circuit, respectively, which are used when necessary.

The input FM signal at the input terminal 15 is applied to the discriminator 14 which demodulates the input signal, through the reference bandpass filter 7, the variable bandpass filter 8 and the limiter 13. The demodulated signal is applied to the output terminal 16. The phase-detector 10 compares the phase of the input signal of the variable bandpass filter 8, with the phase of the output signal of the same to perform the phase detection. The bandpass filter 11 derives the color sub-carrier component (3.58 MHz) from the output of the phase detector 10. The color sub-carrier component thus derived is applied to the variable bandpass filter 8 to adjust the center frequency of that variable bandpass filter 8 through the adjuster 12 which adjusts the amplitude of the color sub-carrier component. The switch 18 is inserted when necessary to stop the adjustment of the center frequency of the variable bandpass filter 8.

On the other hand, the level detector 9 detects the input signal level or the value C/N at the input of the variable bandpass filter 8, and the detected level is used to adjust the bandwidth of the variable bandpass filter 8.

In the above configuration, the input signal level which depends upon the bandwidth $B_0$ of the reference bandpass filter 7 is detected by the level detector 9. When the detected level or the value C/N is higher than the threshold level, that is to say, when the value C/N is higher than about 10 dB, the bandwidth of the variable bandpass filter 8 is controlled to be wider than the bandwidth $B_0$ of the reference bandpass filter 7, by the control of the level detector 9. At the same time, the switch 18 is opened if that switch 18 is installed. Accordingly, in this situation (when the signal level is higher than the threshold level) the bandwidth of the input signal of the discriminator 14 is $B_0$.

On the other hand, when the input signal level is equal to or lower than the threshold level, which depends upon the bandwidth $B_0$, the output of the level detector 9 controls the bandwidth of the variable bandpass filter 8 either continuously or stepwise so that said bandwidth becomes narrower. And, the switch 18 is closed in the color sub-carrier signal path, and the center frequency of the variable bandpass filter 8 is contolled so that said center frequency coincides with the instantaneous frequency change of the color sub-carrier component of the FM signal by applying the color sub-carrier component from the phase detector 10 to said variable bandpass filter 8. The adjuster 12 and the phase shifter 17 operates so that said condition (center frequency of the variable bandpass filter coincides with the instantaneous change of the color-subcarrier component) is satisfied. Thus, the value C/N at the output of the variable bandpass filter 8 is improved as compared with that at the input of the same, and therefore, the threshold level for the input signal is also improved. The theoretical effect of the improvement of the threshold level is described later.

By the way, in a conventional frequency discriminator, the bandwidth $B_0$ is usually determined to be:

$$B_0 = 2(\Delta F + f_h)$$

so that the most power of the modulation signal can pass and the waveform of the demodulated signal is kept good. In the above equation, $\Delta f$ is the peak frequency change of an input FM signal, $f_h$ is the highest frequency of the modulation signal. The actual bandwidth is usually a little wider than the value $B_0$ considering the frequency fluctuation of a carrier signal.

If the variable bandpass filter 8 were deleted, or the bandwidth of the variable bandpass filter 8 is wider than the bandwidth $B_0$ of the reference bandpass filter 7, the circuit FIG. 2 functions similar to a conventional FM demodulator.

When the input signal level (C/N) is higher than threshold level, the picture quality of an FM signal depends upon the thermal noise, the non-linearity of the amplitude and/or the phase characteristics of the transmission circuit, and the bandwidth B of the demodulator. When the bandwidth B is narrow, the thermal noise is reduced, but the waveform distortion is increased. Therefore, if the bandwidth is too narrow, even the modulation signal itself is removed, and then, the value C/N is decreased, and the thermal noise is increased.

When the input carrier level is close to the threshold level, the picture quality depends mainly upon the threshold noise (impulse noise), but the effect of the non-linearity of the circuit is masked by the effect of said thermal noise. When the input carrier level is lower than the threshold level, the picture quality is deteriorated rapidly due to the decrease of the signal level, and a picture is masked almost completely by an impulse noise, and the discrimination of a picture becomes almost impossible. Accordingly, the picture quality is substantially determined by said impulse noise, and therefore, the picture quality can be improved by decreasing said impulse noise although the waveform distortion due to the non-linearity of the circuit increases a little.

One of the features of the present invention is to narrow the bandwidth of the signal to improve the value C/N as the value C/N is lowered close to the threshold level. However, if the bandwidth of the signal is narrowed without careful consideration, even the signal component may be removed the bandpass filter when the frequency deviation of the input signal is large. Therefore, the signal level would be lowered more than the noise level, and then, the value C/N would be deteriorated.

Accordingly, the present invention adjusts the center frequency of the bandpass filter so that said center frequency follows to (or coincides with) the instantaneous frequency change of the color sub-carrier component which takes the pre-emphasis in a transmit side. It should be appreciated that the color sub-carrier component with the pre-emphasis takes the highest frequency deviation in the modulated color picture signals. With this configuration, the implementation of the circuit becomes possible and simple.

Now, the picture signal with an emphasis system is considered.

Generally, a color picture signal includes an intensity signal and a color signal, and includes the frequency spectrum up to 4.2 MHz. In those spectrums, an intensity signal distributes in the low frequency area and is the multiple of the horizontal scan frequency (15.75 MHz), and a color signal is located around 3.58 MHz. When that picture signal is processed by a pre-emphases circuit (for instance, CCIR Rec. 405-1 standard pre-emphasis), the low frequency portion is weighted about −10 dB, and the high frequency portion is weighted about +3 dB.

The standard color bar signal which has the highest saturation level in the picture signal, has the maximum amplitude 140 IRE of the total signal, the maximum amplitude 77 IRE of the intensity signal, and the maximum amplitude 88 IRE of the color sub-carrier component (3.58 MHz). Accordingly, when that signal is processed by the pre-emphasis circuit, the amplitude of the color sub-carrier component is 127 IRE, which is close to the maximum amplitude 140 IRE of the original signal. Accordingly, it is the color sub-carrier component that has the maximum frequency deviation, and has much effect on the value C/N by using a narrow bandpass filter, in a pre-emphasized picture signal. Therefore, the present invention controls the center frequency of the variable bandpass filter following to the color sub-carrier component of 3.58 MHz so that the picture signal is transmitted to the discriminator and the noise is removed to improve the ratio C/N. It should be appreciated that said color sub-carrier component has almost a single frequency, and therefore, a simple circuit may control both the amplitude and the phase of that color sub-carrier component (3.58 MHZ).

Now, the operation for controlling the variable bandpass filter 8 by the output of the phase-detector 10 which detects the phase difference between the input and the output of the variable bandpass filter 8, is described in detail.

Figure 3:
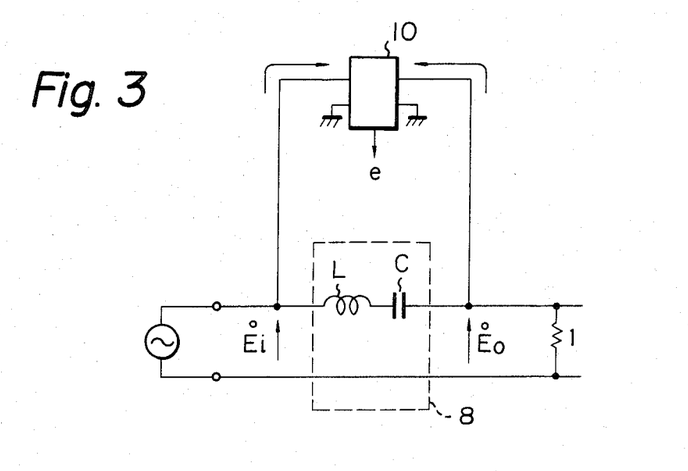
FIG. 3, FIG. 4, FIG. 5, FIG. 6, FIG. 7, FIG. 8, and FIG. 9 are explanatory drawings of the operation of the present invention.

It is assumed that the variable bandpass filter 8 is composed of a single resonator as shown in FIG. 3 for the sake of the simplicity of the explanation. It is also assumed that only a part of the input signal and a part of the output signal of the variable bandpass filter are separated and coupled with the phase-detector 10, and therefore, the voltage and/or the current of the variable bandpass filter is not affected by the presence of the phase-detector.

In FIG. 3, the following relations are satisfied between the input voltage $\dot{E}_i$ and the output voltage $\dot{E}_0$ of the variable bandpass filter.

$$\dot{E}_0 = \frac{\dot{E}_i}{1 + j(2\Delta f/b_0)} \qquad (1)$$

$$= \frac{\dot{E}_i}{1 + (2\Delta f/b_0)^2} [1 - j(2\Delta f/b)]$$

$$\dot{E}_0 = \frac{\dot{E}_i}{\sqrt{1 + (2\Delta f/b_0)^2}} e^{j\tan^{-1}(-(2\Delta f/b_0))} \qquad (1)'$$

where $\Delta f$ is the frequency difference from the center frequency of the bandpass filter, and $b_0$ is the 3 dB bandwidth of the bandpass filter. The phase-detector 10 receives the same signals as those of $\dot{E}_i$ and $\dot{E}_0$.

Figure 4:
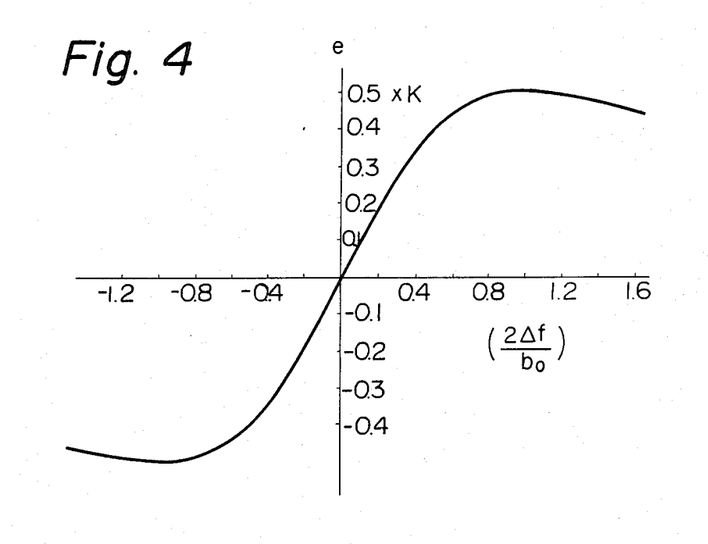

When the input voltage is expressed:

$$\dot{E}_i = E_I e^{j\phi}$$

then the detected output e of the phase-detector 10 is shown below.

$$e = \frac{K}{\sqrt{1 + (2\Delta f/b_0)^2}} \sin[\phi - \tan^{-1}(-(2\Delta f/b_0))] \qquad (2)$$

where K is a constant. When the fixed phase $\phi$ is zero, the relationship between the normalized frequency difference $2\Delta f/b_0$ and the output of the phase-detector is shown in FIG. 4.

In FIG. 4, the output e of the phase-detector 10 for the frequency change of the input signal has the characteristics of a discriminator, and therefore, an FM signal is demodulated. Of course, the color sub-carrier component of 3.58 MHz is also demodulated, and the demodulated color sub-carrier component controls the center frequency of the variable bandpass filter 8 through the filter 11. The direction of the control is determined so that the direction of the change of the input frequency coincides with the direction of the change of the center frequency. If the control gain of the center frequency of the bandpass filter by the output of the phase-detector is sufficiently high, the center frequency of the bandpass filter coincides completely with the change of the color sub-carrier component.

Next, the improvement of the ratio C/N by the control of the center frequency by that color sub-carrier component is described.

Figure 5:
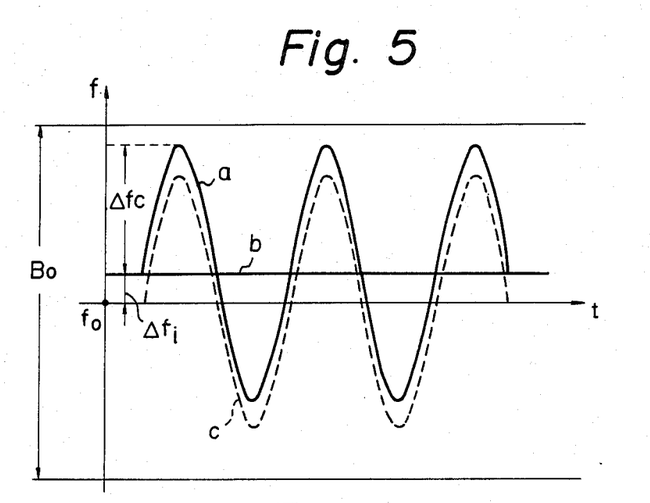

FIG. 5 shows the instantaneous frequency change of an FM signal which passes the reference bandpass filter 7 having the bandwidth $B_0$ (solid line curves (a) and (b)), and the instantaneous change of the center frequency of the variable bandpass filter 8 (dotted line curve (c)). In FIG. 5, $f_0$ is the reference center frequency of the variable bandpass filter when no control is accomplished. It is assumed for the simplicity of the explanation that the instantaneous frequency change is composed of the frequency change (a) of the color sub-carrier component, and the frequency change (b) of the intensity signal, the frequency difference between them is large, and the frequency deviations are $\Delta f_c$ and $\Delta f_i$, respectively. The center frequency (dotted line (c)) of the variable bandpass filter follows to the curve (a), and the frequency deviation of the same is equal to $\Delta f_c$.

Figure 6:
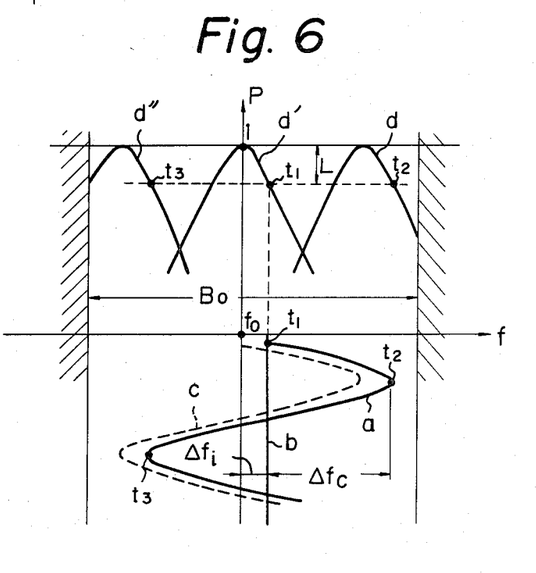

FIG. 6 shows curves between the frequency f (horizontal axis) and the output power P (vertical axis) of the variable bandpass filter 8. In the figure, the solid line curves (a), (b) and (c) show the same characteristics as those of FIG. 5, and the curves (d), (d') and (d'') show some examples of the bandpass characteristics of the variable bandpass filter 8.

In FIG. 6, when the instantaneous frequency is $t_1$ ($=f_0+\Delta f_1$), the center frequency of the variable bandpass filter is $f_0$, and when the instantaneous frequency changes to $t_2$ ($=f_0+\Delta f_i+\Delta f_c$), the center frequency changes to $f_0+\Delta f_c$. Therefore, the frequency difference $\Delta f_i$ is provided between the center frequency of the variable bandpass filter and the instantaneous signal frequency. Therefore, the signal power is decreased by L in the variable bandpass filter. When the variable bandpass filter is composed of a single resonator of FIG. 3, the transfer function is shown by the equation (3).

$$T(f) = 1/(1+(2\Delta f/b_0)^2) \quad (3)$$

where $\Delta f$ is the frequency difference from the center frequency of the filter, and $b_0$ is the 3 dB bandwidth.

When the signal power is normalized to unit 1, and the noise power density is 1/Hz at the input of the variable bandpass filter 8, the noise power when the bandwidth is $B_0$ which is equal to the bandwidth of the reference bandpass filter is $B_0$, and the value $C_i/N_i$ of the input signal is $1/B_0$. Since the signal frequency is apart from the center of the bandpass filter by $\Delta f_i$, the signal output of the bandpass filter is:

$$C_0 = 1/(1+(2\Delta f_i/b_0)^2)$$

The noise power which passes the bandpass filter is not constant, since the center frequency of the variable bandpass filter changes in the bandwidth $B_0$ as shown by the curves (d), (d') and (d'') in FIG. 6. That noise power which passes the bandpass filter is the maximum when the center frequency of the bandpass filter is at the center $f_0$ of the bandwidth $B_0$, and the value C/N at the output of the bandpass filter is minimum at that time. The noise power at that time is given by the following equation.

$$N_0 = 2 \int_0^{\frac{B_0}{2}} \frac{1}{1+2(f/b_0)} df = b_0 \tan^{-1} B_0/b_0 \quad (4)$$

Accordingly, the value C/N ($=C_0/N_0$) at the output of the filter is:

$$C_0/N_0 = [(1+(2\Delta f_i/b_0)^2) b_0 \tan^{-1}(B_0/b_0)]^{-1}$$

Then, the improvement ($\eta$) of the value C/N by the use of the variable bandpass filter is:

$$\eta = \frac{C_0/N_0}{C_i/N_i} \quad (5)$$

$$= [(1+(2\Delta f_i/b_0)^2)(b_0/B_0)\tan^{-1}(B_0/b_0)]^{-1}$$

In an actual satellite relay communication system, a picture signal having the bandwidth 4.2 MHz is transmitted with the frequency deviation up to 10.75 MHz, and the emphasis characteristics recommended by CCIR 405-1 is applied. The bandwidth of a demodulator in that case is 30 MHz.

Figure 7:
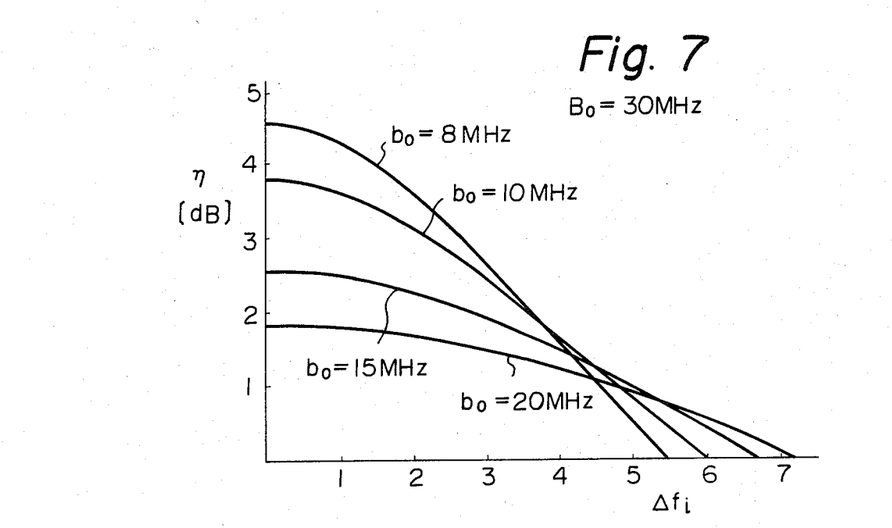

On the other hand, when the present invention is utilized for that picture signal, the improvement shown by the equation (5) by using the present invention is shown in FIG. 7.

In FIG. 7, $b_0$ is the 3 dB bandwidth of the variable bandpass filter, and $\Delta f_i$ is the frequency deviation of an intensity signal at the output of the pre-emphasis circuit in a transmit side. The improvement ($\eta$) in FIG. 7 shows the minimum value as described before, and it should be appreciated that the larger improvement is obtained when the value of $\Delta f_i$ is smaller.

Figure 8:
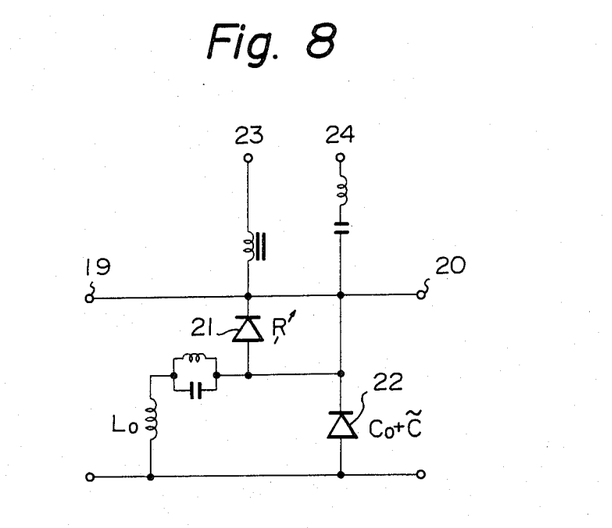

FIG. 8 shows a parallel resonant circuit for the use of a variable bandpass filter. In the figure, the reference numerals 19 and 20 are an input terminal and an output terminal, respectively, of the variable bandpass filter, 21 is a variable resistance element which is implemented for instance by the forward resistance of a diode, 22 is a variable capacitance element which is also implemented by a diode, 23 is an input terminal coupled with the level detector 9 of FIG. 2, 24 is an input terminal coupled with the phase detector 10 for detecting 3.58 MHz signal of FIG. 2. A series resonant circuit, a parallel resonant circuit, and a choke coil are coupled with some input terminals so that control signals at the input terminals are applied to the filter without interference. The inductance $L_0$ and the capacitance $C_0$ (which is the basic capacitance of the variable capacitor 22) are designed so that the center frequency $f_0$ of the input FM signal resonants with the resonant circuit of $L_0$ and $C_0$.

With the above configuration, when the value C/N of the input signal is large, the resistance R of the variable resistance element 21 is high according to the input signal at the input terminal 23, and therefore, the input FM signal at the terminal 19 is passed to the output terminal 20 without restricting the bandwidth. When the value C/N of the input FM signal is reduced, the resistance of the variable resistance element 21 has the low resistance, and then, the parallel resonant circuit composed of the inductance $L_0$ and the capacitance $C_0$ is inserted in the FM signal path. Therefore, the circuit of FIG. 8 functions as a bandpass filter to restrict the bandwidth of the input FM signal. If the control signal is applied to the input terminal 24 which receives the color sub-carrier signal, the capacitance of the variable capacitor 22 changes according to that control signal, and therefore, the resonant frequency of the resonant circuit of $L_0$ and $C_0$ is controlled. As a result, the center frequency of the variable bandpass filter of FIG. 8 changes, and the desired bandpass characteristics are obtained.

Figure 9:
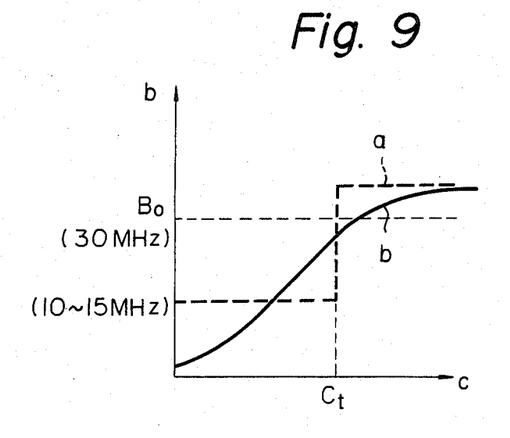

FIG. 9 shows the curve of the bandwidth of the variable bandpass filter 8. The dotted line curve (a) in FIG. 9 shows the characteristics in which the bandwidth changes stepwise when the carrier level C is near the threshold level $C_t$ which is defined by the bandwidth $B_0$ of the reference bandpass filter. The curve (b) in FIG. 9 shows the characteristics in which the bandwidth changes slowly according to the change of the input carrier level C.

Since the sudden change of the bandwidth might deteriorate the picture quality, the curve (b) which changes slowly is preferable.

The degree of the change of the bandwidth of the variable bandpass filter for each input signal level is determined according to the characteristics of the filter and the level detector (or the C/N detector), taking into consideration the relationship between the input signal level and the picture quality. That level detector may use the control voltage of an AGC amplifier in a conventional receiver circuit.

As described above, the present invention uses the nature of a color television signal when the input signal level is equal to or lower than the threshold level, and the nature of the same with the pre-emphasis process. In the above embodiment, a reference bandpass filter, and a variable bandpass filter are connected in cascade form, and the center frequency and the bandwidth of the latter are controllable separately. The input signal and the output signal of the variable bandpass filter are processed by the phase-detector. The bandwidth of the variable bandpass filter is controlled by the output of the level detector (or C/N detector) according to the ratio C/N, and the center frequency of the same is controlled by the color sub-carrier component which is derived using said phase detector. When the input C/N level is high, the bandwidth of the variable bandpass filter has a wideband, and therefore, the bandwidth of the signal is defined by the bandwidth of the reference bandpass filter, and then, an excellent demodulated waveform is obtained. When the input level is decreased below the predetermined C/N level, the bandwidth of the variable bandpass filter is narrowed, and the center frequency of the same follows to the frequency change of the color sub-carrier component of the input signal. Since the variable bandpass filter is controlled by the narrow bandwidth signal, the circuit operates stably, and the desired control condition is satisfied easily. Since the control is accomplished by the particular narrow bandwidth signal, the variable bandwidth filter does not respond to a noise component which is not input to the variable bandpass filter, and therefore, a noise component accompanied to the input signal and having the same frequency as the input picture signal is removed by the variable bandpass filter.

Further, since the circuit for improving the ratio C/N by a variable bandpass filter is completely separated from a discriminator which demodulates an FM signal, the present C/N improvement circuit can be attached to a prior FM demodulator. Thus, the present invention is convenient to use and improves the ratio C/N of an input signal and/or picture quality.

Figure 10:
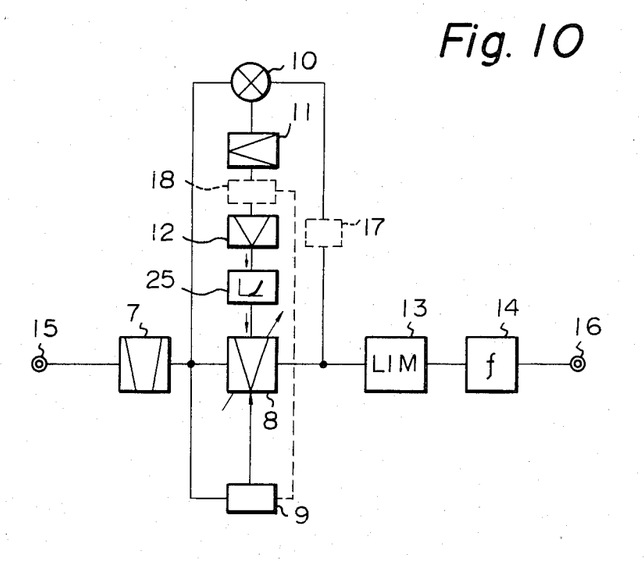
FIG. 10 is a block diagram of another embodiment of the present demodulation system.

FIG. 10 shows the second embodiment of the present invention. The feature of FIG. 10 is the presence of a non-linear circuit 25 inserted in the control circuit of the color sub-carrier circuit. The non-linear circuit 25 has the characteristics that the ratio ($S_0/S_i$) of the output level to the input level of the same depends upon the input signal level $S_i$.

Figure 11:
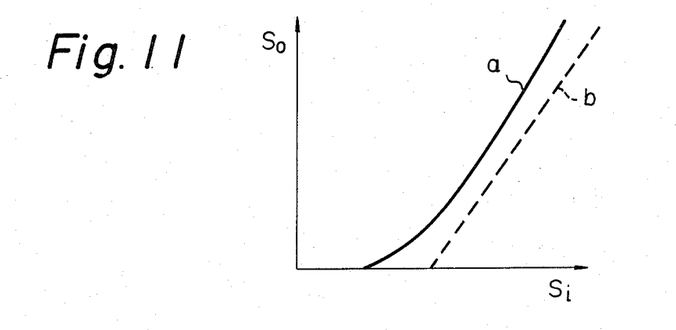
FIG. 11 is the explanatory drawing of the non-linear circuit of FIG. 10.

Other portions of FIG. 10 are the same as those of FIG. 2. Said non-linear circuit is implemented by using a combination of non-linear resistance components, and has the characteristics as shown by the curve (a) or (b) of FIG. 11. As shown in FIG. 11, when the input signal level $S_i$ is low, the ratio $S_0/S_i$ is small, and when the level $S_i$ is high, the ratio $S_0/S_i$ is also high.

It should be noted in the previous embodiment of FIG. 2 that the color sub-carrier component which is demodulated by the phase-detector and is derived by the filter 11 accompanies some noise power within the passband of the filter 11. Therefore, when the level of the color sub-carrier component is low, that is to say, when the saturation level of the color is low, said noise component is amplified by the amplifier 12, the output of which disturbs the operation of the bandpass filter 8. Therefore, the noise component at the input terminal 15 would pass the variable filter, and would be demodulated.

Said noise component is a color noise on a picture screen, and deteriorates the picture quality. Accordingly, the non-linear circuit 25 is provided in the control circuit of the color sub-carrier component so that when the level of the color sub-carrier component is low, the control signal to the variable bandpass filter 8 is also decreased to prevent the variable bandpass filter from being disturbed by the noise component. Thus, the deterioration of the picture quality by the color noise is prevented.

Figure 12:
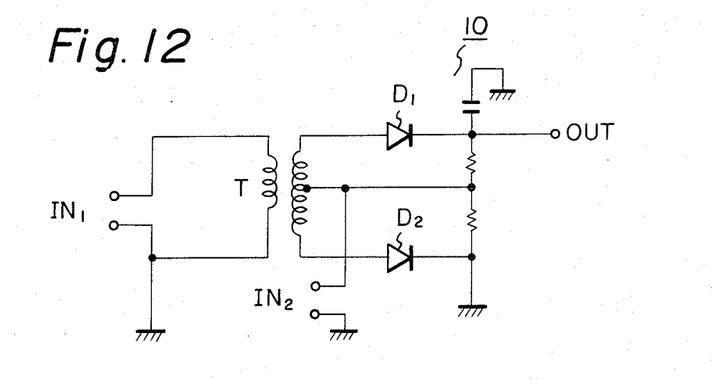
FIG. 12 is a circuit diagram of a phase-detector.

FIG. 12 is a circuit diagram of the phase detector 10, having the diodes $D_1$ and $D_2$, and the transformer T. The input signals are applied to the first input terminal $IN_1$ and the second input terminal $IN_2$, and the output signal is provided to the output terminal OUT.

Figure 13:
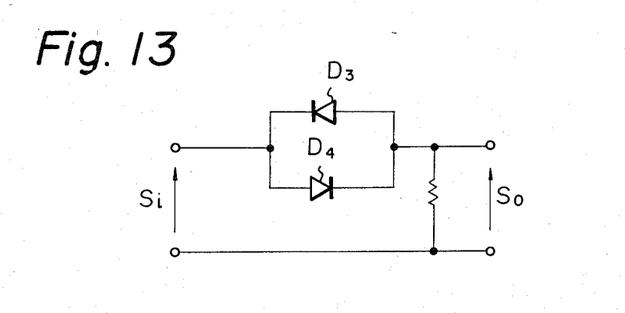
FIG. 13 is a circuit diagram of a non-linear circuit.

FIG. 13 is a circuit diagram of the non-linear circuit 25, having a pair of diodes $D_3$ and $D_4$ coupled in parallel with the opposite polarities.

APPLICATION TO INDUSTRIES

The present invention is implemented simply by using a variable bandpass filter, a reference filter, a color sub-carrier component control circuit, and a frequency discriminator, and improves the ratio S/N of the demodulated signal at the particular input signal level, and improves the picture quality. Accordingly, the present invention is utilized in a receiver in a satellite communication system in which input signal level of a picture signal modulated in an FM system is very low.

I claim:
1. A high sensitivity FM signal demodulation system comprising:
   an input terminal (15) for receiving a television FM signal,
   a variable bandpass filter (8) coupled with said input terminal, the center frequency and the bandwidth of said variable bandpass filter being controllable,
   a limiter circuit (13) and a frequency discriminator (14) coupled with the output of said variable bandpass filter,
   an output terminal (16) coupled with the output of said frequency discriminator, a phase detector circuit (10) coupled with the input and the output of said variable bandpass filter (8), a narrow-band bandpass filter (11) coupled with the output of said phase detector (10) for deriving the color sub-carrier component of a picture signal, a color sub-carrier adjuster (12), responsive to the output of the narrow bandpass filter (11), for controlling said variable bandpass filter (8) by adjusting the amplitude and the phase of the output of said narrow-band bandpass filter (11), a level detector (9) for measuring the input signal level of said variable bandpass filter (8) and which is operative to control the bandwidth of said variable bandpass filter (8) according to the measured input signal level, the bandwidth of said variable bandpass filter (8) being controlled to be wide by the output of said level detector (9) when the input level of said television FM signal is higher than a threshold level (C/N), and said bandwidth of said variable bandpass filter (8) being controlled to be narrow as said television FM signal level decreases, and the center frequency of said variable bandpass filter (8) being controlled by the output of said phase detector (10) so that said center frequency follows to the instantaneous frequency of said color sub-carrier component, and a signal demodulated by said frequency discriminator (14) being applied to said output terminal (16).

2. A high sensitivity FM signal demodulation system according to claim 1, wherein said variable bandpass filter (8) comprises a parallel resonant circuit with a fixed inductance element of the inductance $L_0$ and a variable capacitance element (22), and the capacitance of said variable capacitance element (22) is controlled by said color sub-carrier component.

3. A high sensitivity FM signal demodulation system according to claim 2, wherein said parallel resonant circuit is coupled with a signal path through a diode (21), and the bandwidth of said variable bandpass filter (8) is adjusted by adjusting the resistance of the diode according to the output of the level detector (9).

4. A high sensitivity FM signal demodulation system according to claim 1, wherein a switch circuit (18) is provided at the output circuit of the phase-detector (11) so that the control of the center frequency of the variable bandpass filter (8) is accomplished only when the bandwidth of said variable bandpass filter is narrow.

5. A high sensitivity FM signal demodulation system according to claim 1, wherein a reference bandpass filter having a fixed bandwidth is provided between the input terminal (15) and the variable bandpass filter (8).

6. A high sensitivity FM signal demodulation system according to claim 1, wherein the bandwidth of the variable bandpass filter (8) is about 30 MHz when the carrier to noise ratio C/N is higher than 10 dB, and said bandwidth is about 15 MHz when the ratio C/N is equal to or less than 10 dB.

7. A high sensitivity FM signal demodulation system comprising:

an input terminal (15) for receiving a television FM signal, a variable bandpass filter (8) coupled with said input terminal, the center frequency and the bandwidth of said variable bandpass filter being controllable, a limiter circuit (13) and a frequency discriminator (14) coupled with the output of said variable bandpass filter, an output terminal (16) coupled with the output of said frequency discriminator, a phase detector circuit (10) coupled with the input and the output of said variable bandpass filter (8), a narrow-band bandpass filter (11) coupled with the output of said phase detector (10) for deriving the color sub-carrier component of a picture signal, a non-linear circuit (25) for adjusting the level of said color sub-carrier component non-linearly, a color sub-carrier adjuster (12), responsive to the output of the narrow bandpass filter (11), for controlling said variable bandpass filter (8) by adjusting the amplitude and the phase of the output of said narrow-band bandpass filter (11), a level detector (9) for measuring the input signal level of said variable bandpass filter (8) and which is operative to control the bandwidth of said variable bandpass filter (8) according to the measured input signal level, the bandwidth of said variable bandpass filter (8) being controlled to be wide by the output of said level detector (9) when the input level of said television FM signal is higher than a threshold level (C/N), and said bandwidth of said variable bandpass filter (8) being controlled to be narrow as said television FM signal level decreases, and the center frequency of said variable bandpass filter (8) being controlled by the output of said phase detector (10) so that said center frequency follows to the instantaneous frequency of said color sub-carrier component, and a signal demodulated by said frequency discriminator (14) being applied to said output terminal (16).

8. A high sensitivity FM signal demodulation system according to claim 7, wherein said variable bandpass filter (8) comprises a parallel resonant circuit with a fixed inductance element of the inductance $L_0$ and a variable capacitance element (22), and the capacitance of said variable capacitance element (22) is controlled by said color sub-carrier component.

9. A high sensitivity FM signal demodulation system according to claim 8, wherein said parallel resonant circuit is coupled with a signal path through a diode (21), and the bandwidth of said variable bandpass filter (8) is adjusted by adjusting the resistance of the diode according to the output of the level detector (9).

10. A high sensitivity FM signal demodulation circuit according to claim 7, wherein a switch circuit (18) is provided at the output circuit of the phase-detector (11) so that the control of the center frequency of the variable bandpass filter (8) is accomplished only when the bandwidth of said variable bandpass filter is narrow.

11. A high sensitivity FM signal demodulation system according to claim 7, wherein a reference bandpass filter having a fixed bandwidth is provided between the input terminal (15) and the variable bandpass filter (8).

12. A high sensitivity FM signal demodulation system according to claim 7, wherein the bandwidth of the variable bandpass filter (8) is about 30 MHz when the carrier level to noise level ratio C/N is higher than 10 dB, and said bandwidth is about 15 MHz when the ratio C/N is equal to or less than 10 dB.

* * * * *